United States Patent
Nunan

(10) Patent No.: US 9,446,948 B1
(45) Date of Patent: Sep. 20, 2016

(54) APPARATUS AND METHOD OF FORMING A MEMS DEVICE WITH ETCH CHANNELS

(71) Applicant: Analog Devices, Inc., Norwood, MA (US)

(72) Inventor: Thomas Kieran Nunan, Carlisle, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/632,277

(22) Filed: Feb. 26, 2015

(51) Int. Cl.
*H01L 21/00* (2006.01)
*B81C 1/00* (2006.01)

(52) U.S. Cl.
CPC ... *B81C 1/00476* (2013.01); *B81C 2201/0132* (2013.01); *B81C 2201/0133* (2013.01)

(58) Field of Classification Search
CPC ... H01L 8/0037; H01L 9/0076; H01L 29/84; H01L 2924/01079; G01L 9/0037; G01L 9/0076; G01L 29/84
USPC ............................................. 438/50, 52, 53
See application file for complete search history.

(56) References Cited

U.S. PATENT DOCUMENTS

| | | | |
|---|---|---|---|
| 6,789,423 B2 | 9/2004 | An et al. | 73/504.04 |
| 8,691,607 B2 | 4/2014 | Ararao | 438/48 |
| 8,877,537 B2 | 11/2014 | Mao et al. | 438/52 |
| 8,932,893 B2 | 1/2015 | Lagouge | 438/51 |
| 9,216,897 B2 * | 12/2015 | Chan | B81B 3/0021 |
| 2011/0049652 A1 * | 3/2011 | Wu | B81C 1/00246 257/417 |
| 2013/0168852 A1 | 7/2013 | Liang et al. | 257/737 |
| 2014/0252512 A1 | 9/2014 | Yang et al. | 257/416 |
| 2014/0287548 A1 | 9/2014 | Lin et al. | 438/50 |
| 2014/0374885 A1 | 12/2014 | Chang et al. | 257/622 |

\* cited by examiner

*Primary Examiner* — Quoc Hoang
(74) *Attorney, Agent, or Firm* — Sunstein Kann Murphy & Timbers LLP

(57) ABSTRACT

A method of fabricating a MEMS device provides a device substrate, forms a plurality of trenches in/on the substrate, and forms a sacrificial material on the substrate (e.g., growing or depositing the sacrificial material) to form a plurality of etch channels. Each trench defines one etch channel, and each etch channel forms an interior configured to channel etchant. The method also bonds a handle substrate to the sacrificial material of the device substrate, and removes at least a portion of the sacrificial material.

20 Claims, 9 Drawing Sheets

US 9,446,948 B1

APPARATUS AND METHOD OF FORMING A MEMS DEVICE WITH ETCH CHANNELS

FIELD OF THE INVENTION

The invention generally relates to microelectromechanical systems ("MEMS") and, more particularly, the invention relates to methods of forming MEMS devices.

BACKGROUND OF THE INVENTION

Microelectromechanical systems ("MEMS," also referred to as "MEMS devices") are a specific type of integrated circuit used in a growing number of applications. For example, MEMS currently are implemented as microphones in mobile telephones and tablets, gyroscopes to detect pitch angles of airplanes, and accelerometers to selectively deploy air bags in automobiles. In simplified terms, such MEMS devices typically have a fragile movable structure suspended above a substrate, and associated circuitry (on chip or off chip) that both senses movement of the suspended structure and delivers the sensed movement data to one or more external devices (e.g., an external computer). The external device processes the sensed data to calculate the property being measured (e.g., pitch angle or acceleration).

Micromachining processes often form MEMS devices using additive and subtractive processes. For example, during fabrication, some processes deposit sacrificial material under the movable structure. To release the movable structure (i.e., so that it may be in a movable state), the sacrificial material under that movable structure must be removed. Although this process has been commonplace for years, removal of the sacrificial material can present a number of fabrication and performance problems.

SUMMARY OF VARIOUS EMBODIMENTS

In accordance with one embodiment of the invention, a method of fabricating a MEMS device provides a device substrate, forms a plurality of trenches in/on the substrate, and forms a sacrificial material on the substrate (e.g., growing or depositing the sacrificial material) to form a plurality of etch channels. Each trench defines one etch channel, and each etch channel forms an interior configured to channel etchant. The method also bonds a handle substrate to the sacrificial material of the device substrate, and removes at least a portion of the sacrificial material.

Among other things, the device substrate may include a doped wafer (e.g., a highly doped silicon wafer). Moreover, some embodiments also form a movable mass on the device substrate. The act of removing at least a portion of the sacrificial material thus may release the movable mass.

The method may form at least one etchant path may through the device substrate, extending to the sacrificial material. In that case, the method may direct etchant through the etchant path to the sacrificial material. The etchant thus traverses through the plurality of etch channels to remove the at least a portion of the sacrificial material.

Some embodiments may etch the device substrate to form a movable mass and a second portion. In that case, the etchant path may be formed through the second portion of the device substrate, through the movable mass, or through both the movable mass and the second portion (e.g., if there is a second or plurality of etchant paths).

The substrate may include doped silicon and the sacrificial material may include an oxide (e.g., silicon dioxide). Moreover, the method may etch the device substrate to form a movable mass having a mass thickness. In that case, the plurality of etch channels each may have a depth that is no greater than about 10 percent of the mass thickness (e.g., five percent, four percent, three percent, two percent, two and a fraction percent, etc.).

Some embodiments line each of the plurality trenches with lining sacrificial material before forming the sacrificial material on the etched substrate. The inner dimension of each etch channel thus may be defined by the lining sacrificial material and the formed sacrificial material.

In accordance with another embodiment of the invention, a method of fabricating a MEMS device provides a device substrate having a top surface, forms a plurality of trenches along the top surface of the substrate in a direction that is generally parallel with the top surface of the substrate, and lines each of the plurality of trenches of the substrate with a sacrificial material. Each of the lined trenches forms an open channel. The method also forms a sacrificial material on the substrate over the plurality of open channels. The sacrificial material lining the trenches integrates with the formed sacrificial material to form a plurality of closed etch channels. Each etch channel has an interior region configured to channel etchant at least in a direction that is generally parallel with the top surface of the device substrate. The method further bonds a handle substrate to the sacrificial material of the device substrate, and removes at least a portion of the sacrificial material.

In accordance with other embodiments of the invention, a method of forming a MEMS device provides an unreleased apparatus having a device substrate bonded to a handle substrate. Among other things, the device substrate has unreleased microstructure and sacrificial material between the unreleased microstructure and the handle substrate. The device substrate at least in part has a plurality of trenches lined with the sacrificial material to at least in part define a plurality of etch channels. In addition, the device substrate further has at least one etchant path extending to the sacrificial material. The method directs etchant through the at least one etchant path to remove at least a portion of the sacrificial material between the unreleased microstructure and the handle substrate to release the unreleased microstructure.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

In illustrative embodiments, to more efficiently remove sacrificial oxide, a process of forming a MEMS device produces a network of etchant channels along the bottom side of a releasable mass. To that end, the process first etches trenches directly in the bottom side of the mass, and then at least in part seals those trenches with sacrificial oxide. The oxide preferably is applied to the substrate to form a network of elongated voids that each directs etchant, such as hydrofluoric acid, through and along the sacrificial oxide. This wide distribution of etchant effectively releases the mass, forming the operable MEMS device. Details of illustrative embodiments are discussed below.

Figure 1:
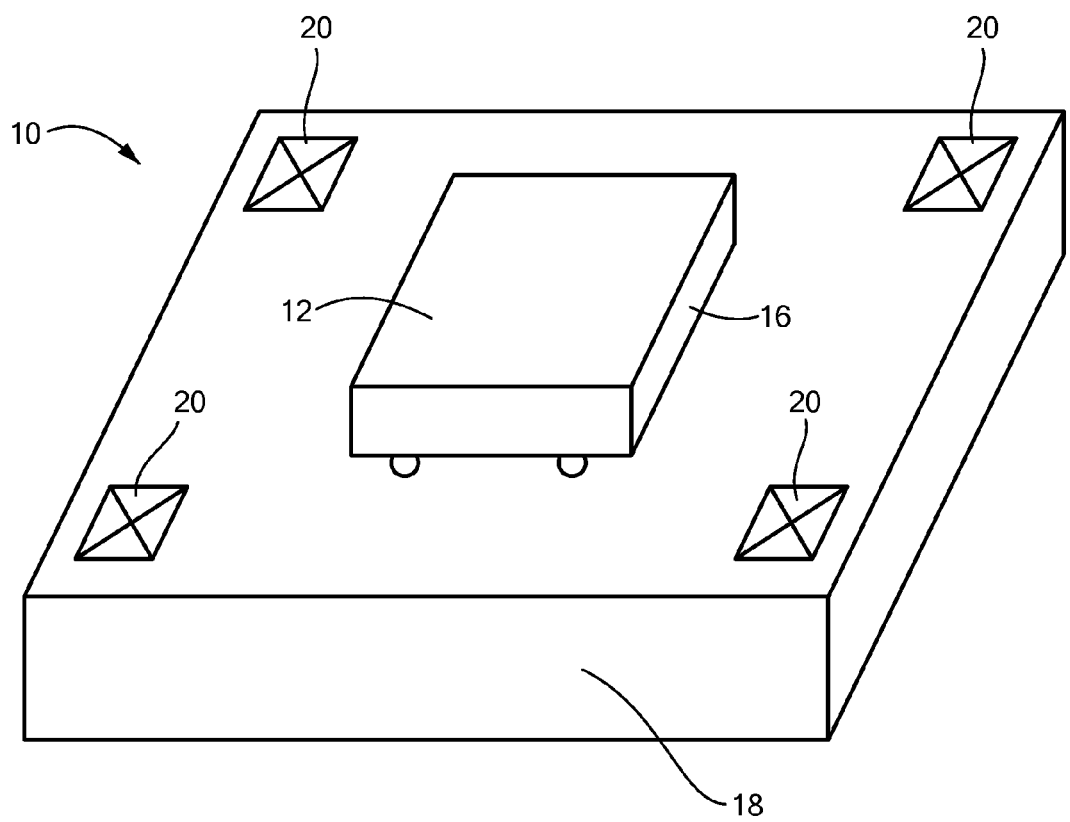
FIG. 1 schematically shows an exemplary MEMS device that can be formed in accordance with illustrative embodiments of the invention.

FIG. 1 schematically shows an exemplary MEMS system 10 that can be formed in accordance with illustrative embodiments of the invention. The MEMS system 10 includes a packaged MEMS device 12 having a die 14 (shown in cross-section in subsequent figures and also referred to as "MEMS die 14") within a conventional package 16. The package 16 is coupled with a circuit board 18 having interconnects 20 to electrically communicate with an external device, such as a computer.

The packaged MEMS device 12 may implement any conventionally known functionality commonly implemented by a MEMS device, such as an inertial sensor. For example, the packaged MEMS device 12 may be a gyroscope or an accelerometer. Exemplary MEMS gyroscopes are discussed in greater detail in U.S. Pat. No. 6,505,511, which is assigned to Analog Devices, Inc. of Norwood, Mass. Exemplary MEMS accelerometers are discussed in greater detail in U.S. Pat. No. 5,939,633, which also is assigned to Analog Devices, Inc. of Norwood, Mass. The disclosures of U.S. Pat. Nos. 5,939,633 and 6,505,511 are incorporated herein, in their entireties, by reference. Illustrative embodiments also are implemented in bulk acoustic wave gyroscopes, which typically require very thin oxide release layers and, as known by those in the art, do not oscillate back and forth within a cavity.

Although the packaged MEMS device 12 is discussed as an inertial sensor, principles of illustrative embodiments can apply to other MEMS devices, such as pressure sensors, switches, and microphones. Accordingly, discussion of an inertial sensor is exemplary and not intended to limit the scope of various embodiments of the invention.

Figure 2:
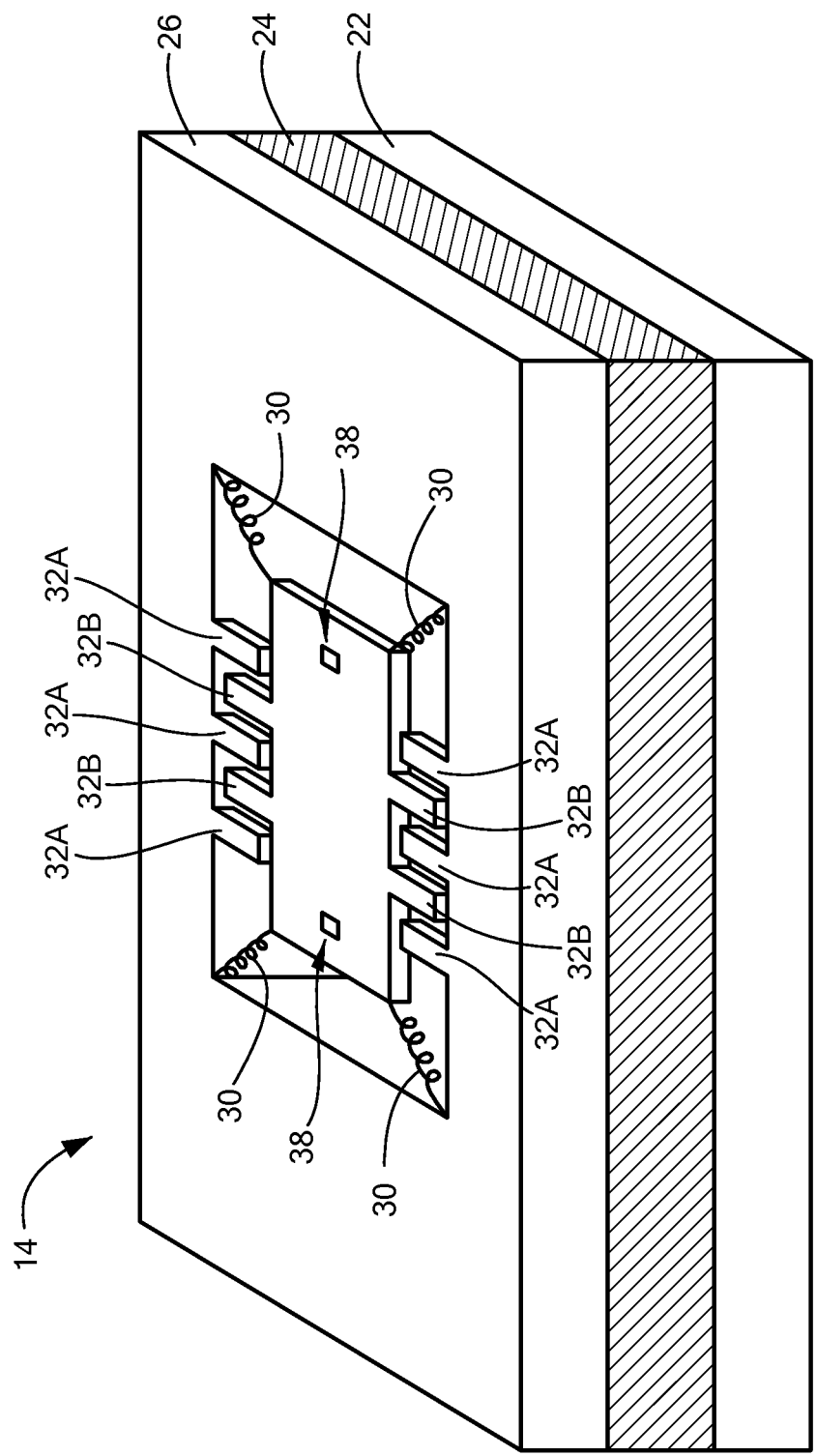
FIG. 2 schematically shows a partial perspective view of a MEMS device that may be fabricated in accordance with illustrative embodiments of the invention.

FIG. 2 schematically shows a partial-perspective view of the MEMS die 14 fabricated in accordance with illustrative embodiments of the invention. In this case, the die 14 has a base silicon wafer, referred to herein as a "handle wafer 22" or "handle layer 22," supporting an oxide layer 24 that itself supports a device substrate having movable and unmovable microstructure. The device substrate is referred to herein as the "device layer 24" or the "device wafer 26" because it contains much of the primary MEMS functionality. To that end, as shown, the device layer 26 has a movable mass 28 suspended above both the oxide layer 24 and handle layer 22 by a plurality of springs 30. The springs 30 may take on a number of forms, such as a serpentine shape commonly used for MEMS fabrication.

Illustrative embodiments implement the MEMS device using capacitive coupling techniques. Accordingly, to sense movement of the mass 28, the device layer 26 also has a plurality of interdigitated fingers. Specifically, interdigitated fingers include a plurality of "stationary fingers 32A" that are stationary relative to the device layer 26, and a plurality of "movable fingers 32B" integrally extending from the mass 28. Although not necessary, most or all of the movable fingers 32B are normally positioned between at least two stationary fingers 32A and thus, are considered to be "interdigitated." It should be noted that although movable fingers 32B are shown extending from two sides of the mass 28, some embodiments may have movable fingers 32B extending from all sides of the mass 28.

Various embodiments implemented as an accelerometer thus determine acceleration as a function of the distance between the interdigitated fingers 32A and 32B. Some embodiments implemented as a vibratory gyroscope, however, may use some of the fingers to vibrate the movable mass 28, and other fingers to detect Coriolis movement. Other capacitively coupled embodiments, such as capacitively coupled bulk acoustic wave gyroscopes, may use other modes of operation. Indeed, the MEMS die 14 has other not-shown components, such as bond pads, for effectively performing its function. Omission of such components is nevertheless for simplicity only and not intended to suggest that such components are unnecessary.

It also should be noted that discussion of an accelerometer having the discussed configuration is for illustrative purposes only and not intended to limit various embodiments of the invention. Principles of the discussed embodiments can therefore apply to other MEMS devices, such as bulk acoustic wave gyroscopes, microphones, pressure sensors, and other MEMS devices. Moreover, principles of illustrative embodiments may apply to non-capacitive MEMS devices, such as those that operate using piezoelectric sensing mechanisms.

Illustrative embodiments form the MEMS device in a more efficient manner. Specifically, as highlighted below, the MEMS device is configured to more easily release the movable MEMS without requiring a large number of etchant paths through the movable mass 28. This configuration therefore favorably maintains more mass of the movable mass 28 (e.g., twenty to thirty percent larger than current techniques known to the inventor), which improves the signal-to-noise ratio of the device. This performance improvement is enabled substantially due to the innovative process of fabricating MEMS device, which itself removes some portion of the movable mass 28 (a smaller portion).

Figure 3:
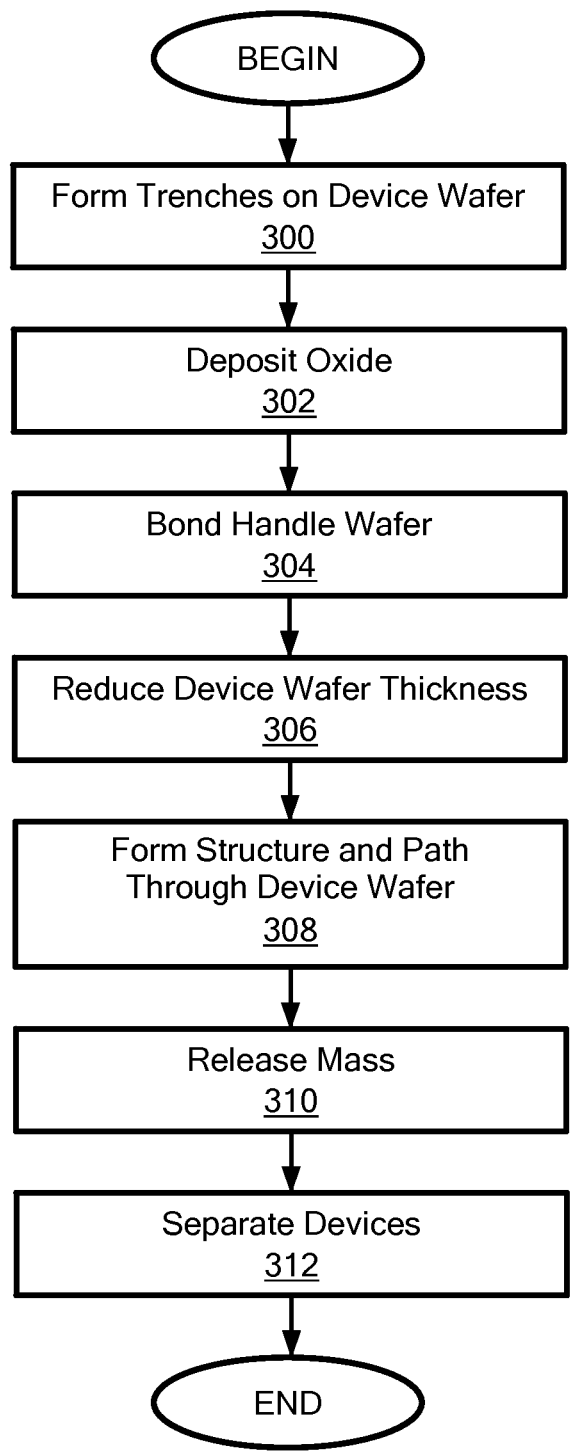
FIG. 3 shows a process of forming the MEMS device of FIG. 2 in accordance with illustrative embodiments of the invention.

FIG. 3 therefore shows a process of forming the MEMS device of FIG. 2 in accordance with illustrative embodiments of the invention. This process is substantially simplified from a longer process that normally would be used to form the MEMS device. Accordingly, the process of forming the MEMS device has many steps, such as testing steps or additional passivation steps that those skilled in the art likely would use. In addition, some of the steps may be performed in a different order than that shown, or at the same time. Those skilled in the art therefore can modify the process as appropriate.

It also should be noted that the process of FIG. 3 is a bulk process, which forms a plurality of MEMS devices on the same wafer/base at the same time. Although much less efficient, those skilled in the art can apply these principles to a process that forms only one MEMS device. FIGS. 4A through 4G graphically show the progression of this process.

Figure 4A:
FIG. 4A schematically shows a cross-section of a substrate to be used to fabricate the MEMS device of FIG. 2.
Figure 4B:
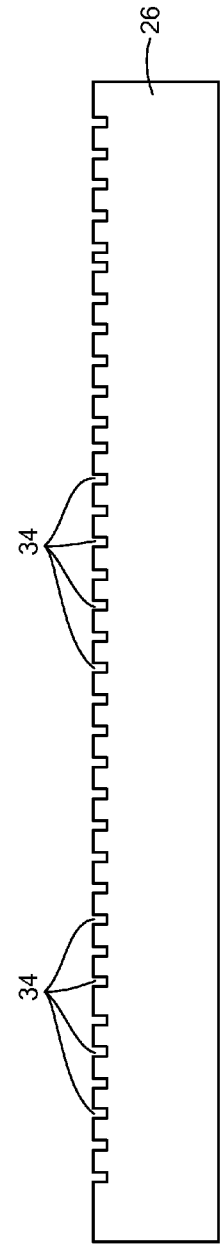
FIG. 4B schematically shows a cross-section of the substrate of FIG. 4A with recently formed release trenches (step 300).

The process begins at step 300, in which conventional processes form a plurality of shallow trenches 34 in the device layer 26. More specifically, FIG. 4A schematically shows a cross-sectional view of a device layer 26 before any substantial processing. As shown, in this state, the device layer 26 has top and bottom surfaces (from the perspective of the drawings) that are generally planar. In illustrative embodiments, at this stage, the device layer 26 is a heavily doped base wafer, such as a bulk silicon wafer or a silicon-on-insulator wafer ("SOI wafer").

The process forms the trenches 34 (FIG. 4B) using any of a number of conventional techniques, such as masking and etching the top layer, or physically using a saw or other physical mechanism to manually etch the trenches 34 in the top surface. Etching the trenches 34 in the silicon is highly controllable and preferable when compared to etching trenches 34 in other materials, such as oxide. In illustrative embodiments, the trenches 34 are very narrow and shallow relative to their length and the overall thickness of the device layer 26. For example, the final device layer 26 can be formed from a 20-150 micron thick bulk silicon wafer, have a depth of about 1-4 microns, and a width of about 0.5 to 1 micron.

Accordingly, in such implementations, the depth and a width is a very small percentage of the overall thickness of the device layer 26. Indeed, those skilled in the art can vary the thickness and depth of the trenches 34 according to the application and etchant used. Moreover, the trenches 34 may be long and straight, or take on other patterns that facilitate the ultimate release step (discussed below). For example, the trenches 34 may be circular, have right angles, etc. Those skilled in the art can calculate the appropriate distance between trenches 34 (i.e., the pitch between the trenches 34), which may be regular/consistent or irregular/inconsistent.

Figure 4C:
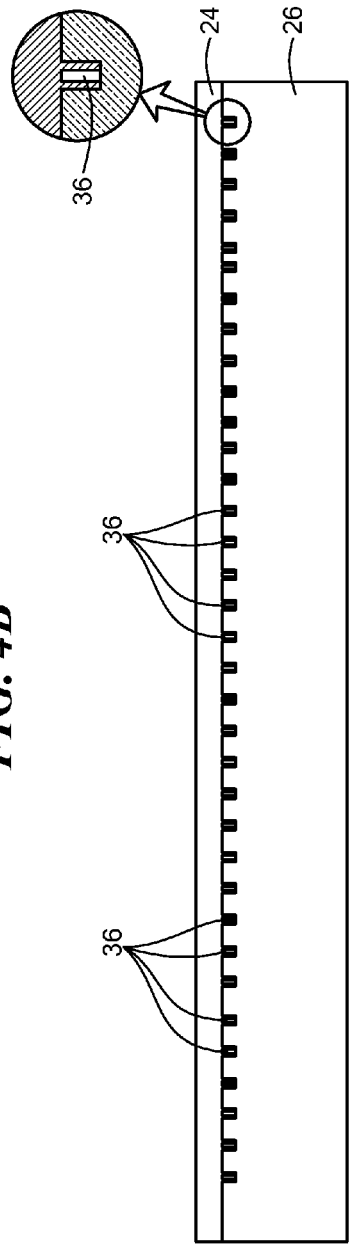
FIG. 4C schematically shows a cross-section of the substrate of FIG. 4A with sacrificial oxide (step 302).
Figure 4D:
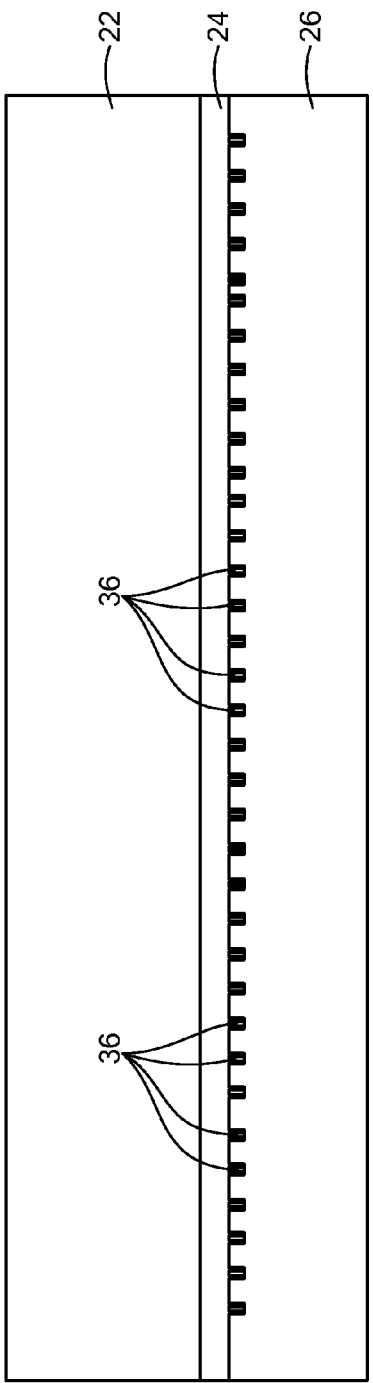
FIG. 4D schematically shows a cross-section of the substrate with a bonded handle wafer forming a bonded structure (step 304).
Figure 4E:
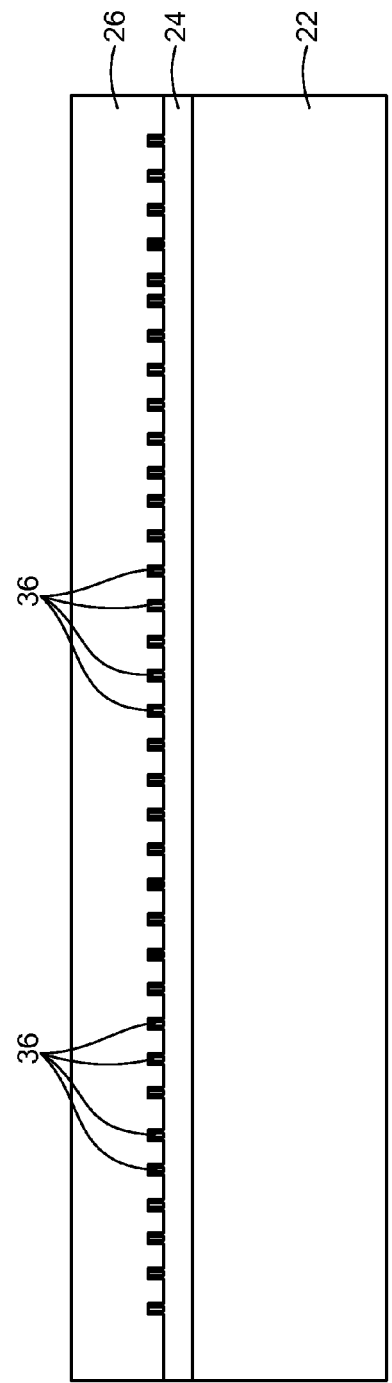
FIG. 4E schematically shows a cross-section of the bonded structure with a substrate having a reduced thickness and rotated 180 degrees (step 306).

After forming the trenches 34, the process continues to step 302, which deposits the oxide layer 24 over the top surface of the device layer 26. Specifically, this step first oxidizes the walls of the trenches 34 to effectively form oxide lined trenches 34. As shown in FIG. 4C, this step deposits the remainder of the oxide 24 over the oxide line trenches 34. Because of the surface tension and other properties of the oxide, the remainder of the sacrificial oxide interacts with the oxide lining the trenches 34 to form a void in each of the trenches 34. As shown, these voids contain no material—they simply are open channels that, as discussed below, channel etchant to remove the portion of the oxide layer 24 forming the sacrificial oxide (also referred to using reference number 24). For each trench 34, the inner dimension of the oxide liner and the remainder of sacrificial oxide forms the inner dimension of its channel. Accordingly, these newly formed channels form a network of etchant channels 36 for subsequent use (discussed below and noted above).

The process continues to step 304, which bonds the handle wafer 22 to the top-facing oxide layer 24 supported by the device layer 26. This step is highlighted in FIG. 4D. Any of a number of conventional bonding techniques may be used, such as a fusion bond between the handle wafer 22 and the oxide layer 24. Of course, because fusion bonding is one example, other bonding technologies may be used.

At this point in the process, the handle wafer 22 is essentially at the top of the stack. Many fabrication processes operate primarily from the top of the workpiece/wafer it is fabricating. Accordingly, before performing the next step, the process may rotate/flip the wafer stack 180 degrees to enable further processing of the device wafer 26. After it is rotated, the process reduces the thickness of the device wafer 26 if it is thicker than desired (step 306, FIG. 4E). For example, the device wafer 26 may have an initial thickness of about 400 to 700 microns. This step may reduce the wafer thickness to be some other required thickness, such as 50 to 75 microns. Of course, as with other dimensions, these thicknesses are mere examples and not intended to limit various embodiments of the invention. As with other steps, this step also may use conventional techniques for thinning the device wafer 26. For example, the process may back-grind the device wafer 26, followed by a polishing step. Other embodiments may chemically reduce thickness of the device wafer 26.

Figure 4F:
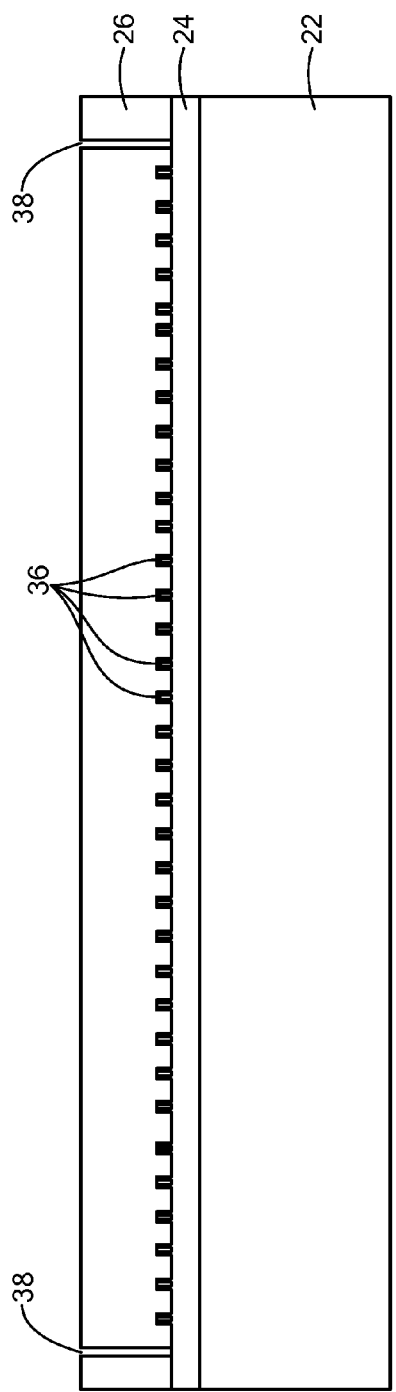
FIG. 4F schematically shows a cross-section of the composite structure with an etchant path through the substrate (step 308).

Now that the device wafer 26 is appropriately oriented and prepared, the process may start forming MEMS structure in/on the device layer 26. To that end, step 308 forms the movable mass 28 in/on the device layer 26, and a release etchant path 38, which extends through the device layer 26 and terminates at the sacrificial oxide layer 24. The process may use conventional masking and silicon etching techniques (subtractive techniques) and additive techniques (e.g., material deposition) as needed for this step. FIG. 4F shows one implementation, clearly showing two etchant paths 38 and only generally showing the microstructure.

Figure 5A:
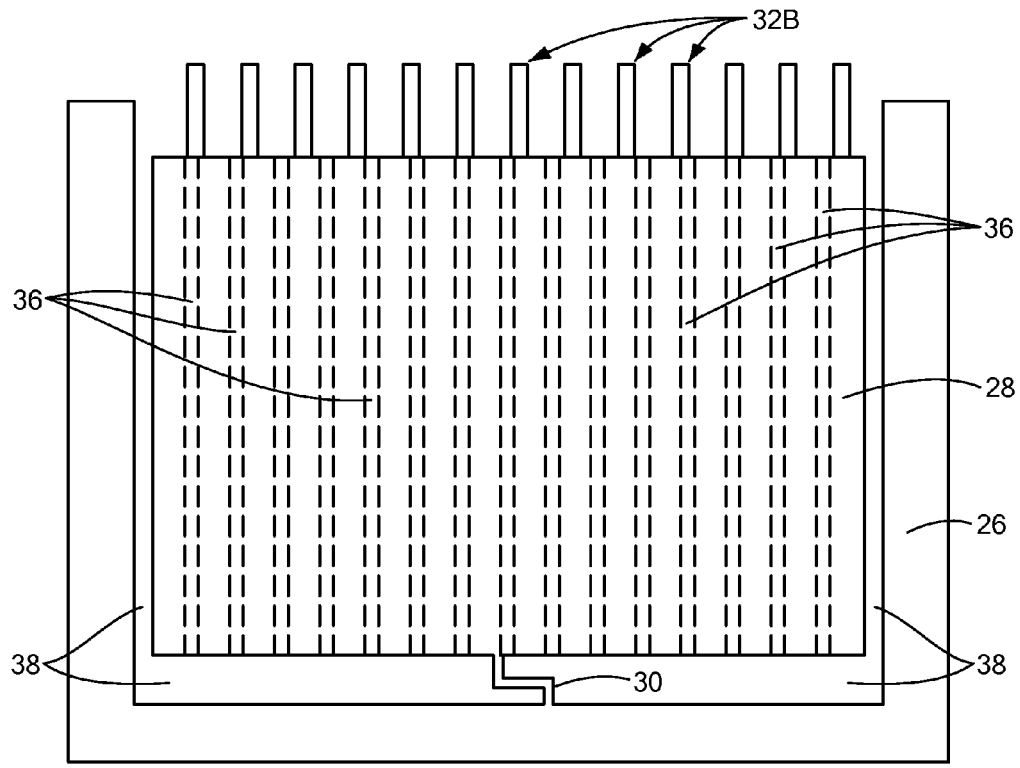
FIG. 5A schematically shows a plan view of the composite structure, with dashed lines showing etchant channels, in accordance with one embodiment of the invention.
Figure 5B:
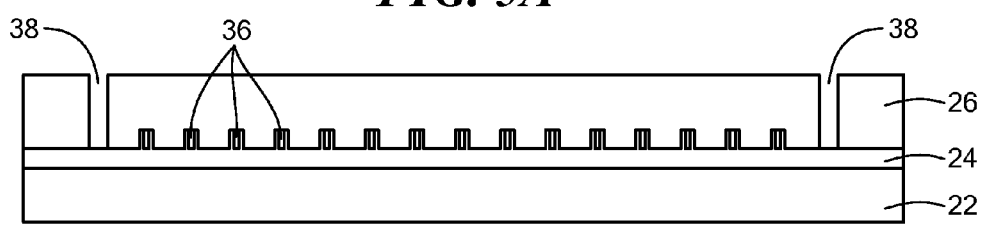
FIGS. 5B and 5C schematically respectively show cross-sections of the embodiment of FIG. 5A before release and after release.
Figure 5C:
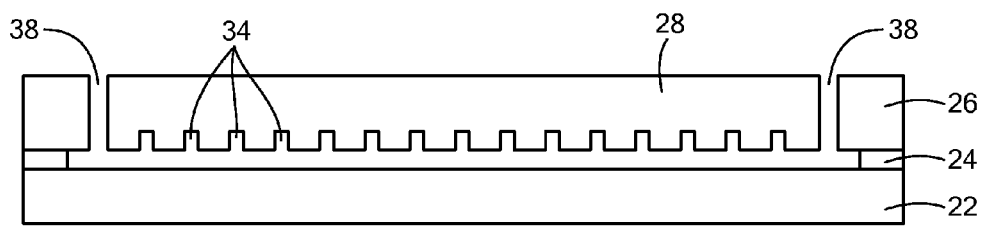
Figure 5D:
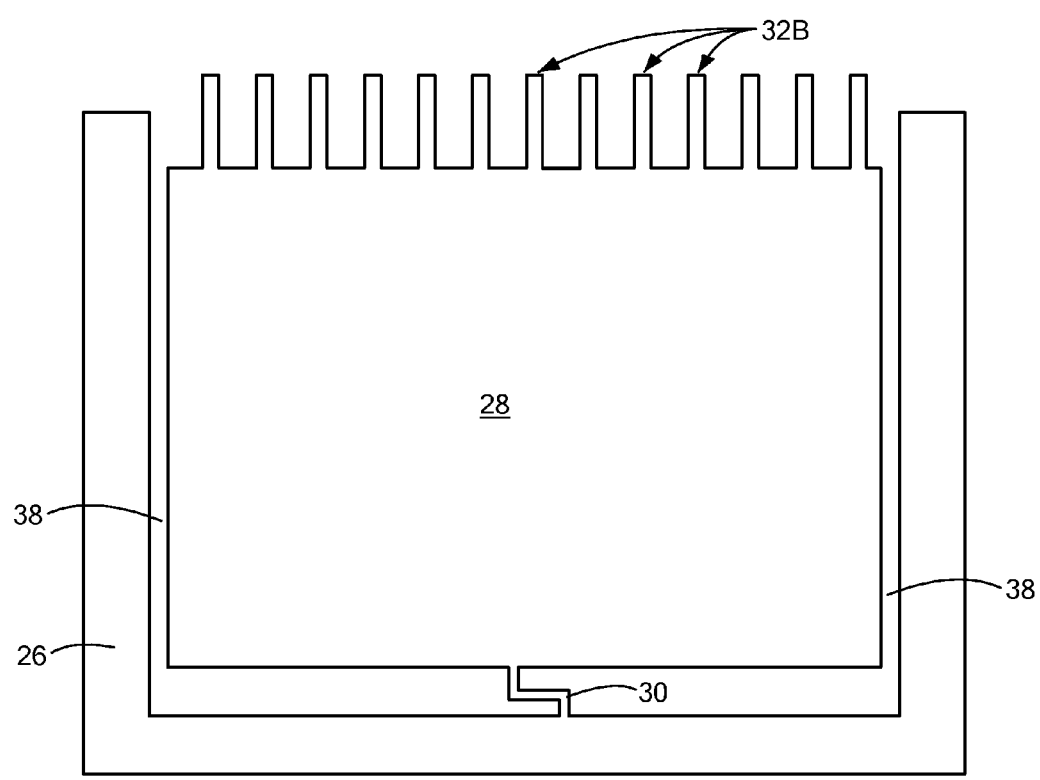
FIG. 5D schematically shows a plan view like that of FIG. 5A, but without the phantom lines showing the etchant channels.

FIG. 5A schematically shows a plan view of a portion of the device wafer 26 at this point in the process, with dashed lines (phantom lines) representing elongated etching channels 36 within the bottom of the movable mass 28. FIG. 5D schematically shows the same device wafer 26 without the phantom etching channels 36. These views also more clearly show the movable mass 28, movable fingers 32B, and one of the springs 30. In this embodiment, the etching channels 36 are spaced away from the movable mass 28—i.e., to a second portion of the device layer 26—to the side of the movable mass 28. FIG. 5B, which is substantially similar to FIG. 4F, shows this correspondence by its alignment with FIG. 5A.

Figure 6A:
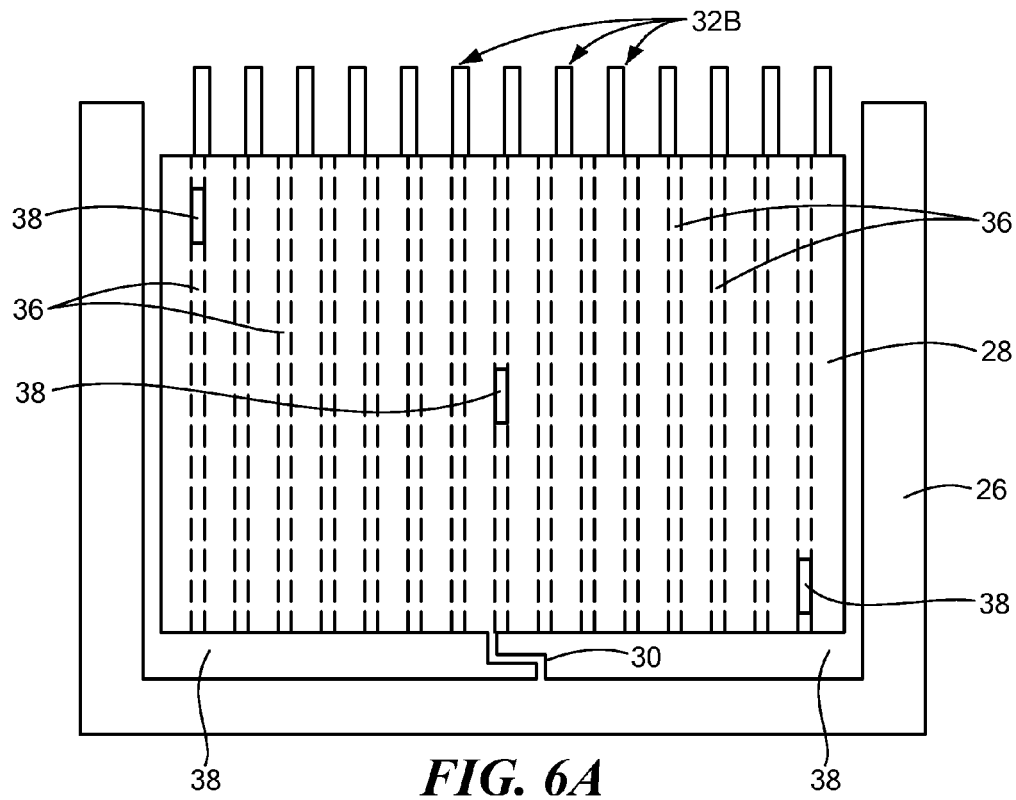
FIG. 6A schematically shows a plan view of the composite structure, with dashed lines showing etchant channels, in accordance with another embodiment of the invention.
Figure 6B:
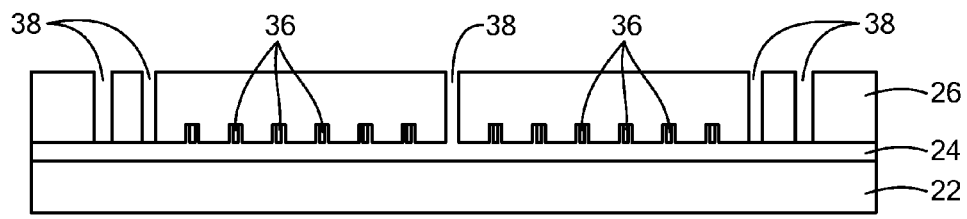
FIGS. 6B and 6C schematically respectively show cross-sections of the embodiment of FIG. 6A before release and after release.

In a manner similar to FIG. 5A, FIG. 6A schematically shows a plan view of a portion of the device wafer 26 at this point in the process, with dashed lines representing elongated etching channels 36. Unlike the embodiment of FIG. 5A, this embodiment forms a small number of etchant paths 38 through the movable mass 28 itself. FIG. 6B schematically shows a cross-sectional view of the apparatus of FIG. 6A. It should be noted that the cross-sectional view is not a precise representation because it shows all three etchant paths 38 through the mass 28. Indeed, this representation is merely illustrative to more clearly show all of the etchant paths 38 through the mass 28.

Borrowing from the concepts of FIGS. 5A and 5B, some embodiments form etchant paths 38 through both the mass 28 (similar to FIG. 6A) and through the second portion of the device layer 26 (similar to FIG. 5A). In this embodiment, the second portion may be a stationary portion of the device layer 26, or another movable structure of the device layer 26.

As shown, these embodiments substantially improve upon the prior art, which most often requires many etch paths through the mass 28 itself. All of those etch paths can remove a significant portion of the mass 28 (e.g., thirty percent), which reduces sensitivity and the signal to noise ratio. In this case, the network of etching channels 36 on the bottom side of the movable mass 28 effectively distributes etchant, effectively minimizing the required etching paths 38 required through the mass 28 (as in FIG. 6A), or completely eliminating the need for etching paths 38 through the mass 28.

Figure 4G:
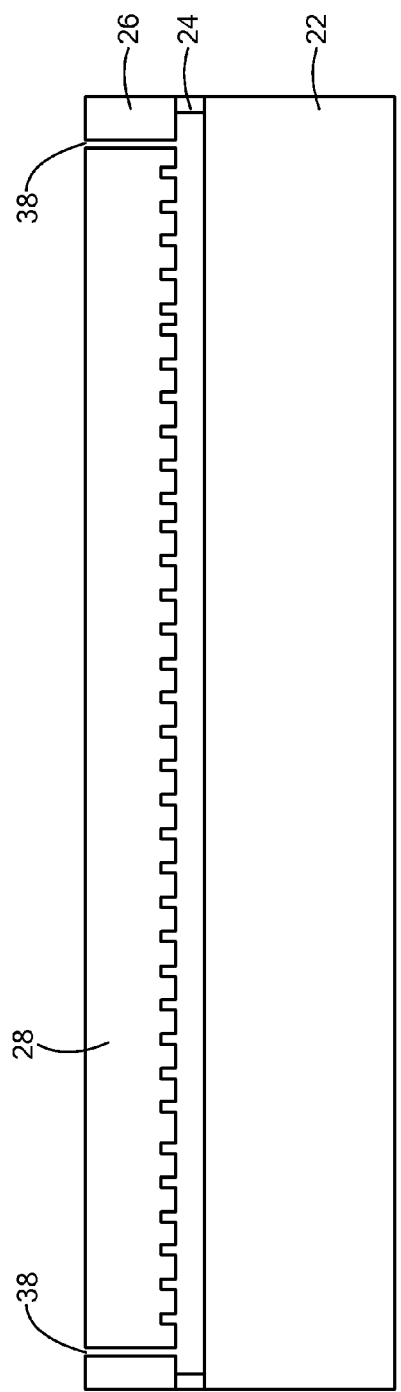
FIG. 4G schematically shows a cross-section of the released composite structure (step 310).
Figure 6C:
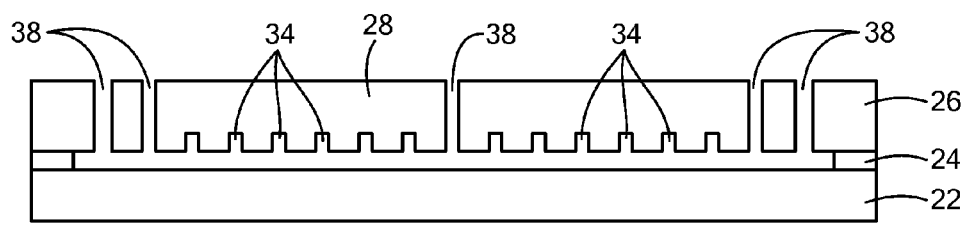

Accordingly, the process continues to step 310, which releases the movable mass 28. To that end, the process may direct and etchant material through the etchant path 38 extending through the device layer 26 and to the sacrificial oxide layer 24. As the etchant removes sacrificial oxide layer 24, it contacts the etchant channels 36 on the bottom side of the mass 28, which distributes the etchant. The etchant may be any of a variety of conventional etchant the required sacrificial layer. In this case, in which the sacrificial material is an oxide, illustrative embodiments may use a vapor hydrofluoric acid, or a liquid form acid. FIG. 4G schematically shows a cross-sectional view of the released MEMS device at this stage of the process. FIGS. 5C and 6C respectively show the released MEMS devices of FIGS. 5A and 6A.

Accordingly, contrary the conventional wisdom, the inventor removed part of the movable mass 28 to form the network of trenches 34 on the bottom side of the movable mass 28. The inventor thus discovered that removing this portion of mass 28 ultimately saved a larger portion of the mass 28 itself. Such a design innovation therefore should increase the final mass of the mass 28 (compared to using current fabrication technologies), favorably increasing the signal and precision of the ultimately formed MEMS device.

Although the above discussion discloses various exemplary embodiments of the invention, it should be apparent that those skilled in the art can make various modifications that will achieve some of the advantages of the invention without departing from the true scope of the invention.

What is claimed is:

1. A method of fabricating a MEMS device, the method comprising:
    providing a device substrate;
    forming a plurality of trenches on the substrate;
    forming a sacrificial material on the substrate over and within the plurality of trenches to form a plurality of closed etch channels, each trench defining one etch channel, each etch channel forming an interior defined by at least a void in the sacrificial material over and within the trench, the etch channel configured to channel etchant;
    bonding a handle substrate to the sacrificial material of the device substrate; and
    removing at least a portion of the sacrificial material.

2. The method as defined by claim 1 wherein the device substrate comprises a doped wafer.

3. The method as defined by claim 1 further comprising forming a movable mass on the device substrate, the act of removing at least a portion of the sacrificial material releasing the movable mass.

4. The method as defined by claim 1 further comprising forming at least one etchant path through the device substrate, the etchant path extending to the sacrificial material.

5. The method as defined by claim 4 further comprising directing etchant through the etchant path to the sacrificial material, the etchant traversing through the plurality of etch channels to remove the at least a portion of the sacrificial material.

6. The method as defined by claim 4 further comprising etching the device substrate to form a movable mass and a second portion, further wherein the etchant path is formed through the second portion of the device substrate.

7. The method as defined by claim 4 further comprising etching the device substrate to form a movable mass and a second portion, further wherein the etchant path is formed through the movable mass of the device substrate.

8. The method as defined by claim 4 further comprising etching the device substrate to form a movable mass and a second portion, further wherein the etchant path is formed through the second portion of the device substrate, the method forming a second etchant path through the movable mass.

9. The method as defined by claim 1 wherein the substrate comprises doped silicon and the sacrificial material comprises oxide.

10. The method as defined by claim 1 further comprising etching the device substrate to form a movable mass having a mass thickness, the plurality of etch channels each having a depth that is no greater than about 10 percent of the mass thickness.

11. The method as defined by claim 1 further comprising lining each of the plurality trenches with lining sacrificial material before forming the sacrificial material on the etched substrate, the inner dimension of each etch channel being defined by the lining sacrificial material and the formed sacrificial material.

12. The apparatus formed by the method as defined by claim 1.

13. A method of fabricating a MEMS device, the method comprising:
    providing a device substrate having a top surface;
    forming a plurality of trenches along the top surface of the substrate in a direction that is generally parallel with the top surface of the substrate;
    lining each of the plurality of trenches of the substrate with a sacrificial material, each of the lined trenches forming an open channel;
    forming a sacrificial material on the substrate over the plurality of open channels, the sacrificial material lining the trenches integrating with the formed sacrificial material to form a plurality of closed etch channels, each etch channel having an interior region configured to channel etchant at least in a direction that is generally parallel with the top surface of the device substrate;
    bonding a handle substrate to the sacrificial material of the device substrate; and
    removing at least a portion of the sacrificial material.

14. The method as defined by claim 13 further comprising forming microstructure in the device substrate, removing at least a portion of the sacrificial material comprising releasing the microstructure.

15. The method as defined by claim 13 further comprising forming at least one etchant path through the device substrate, the etchant path extending to the sacrificial material.

16. The method as defined by claim 15 further comprising directing etchant through the etchant path to the sacrificial material, the etchant traversing through the plurality of etch channels to remove the at least a portion of the sacrificial material.

17. A method of forming a MEMS device, the method comprising:
   providing an unreleased apparatus having a device substrate bonded to a handle substrate, the device substrate having unreleased microstructure and sacrificial material between the unreleased microstructure and the handle substrate, the device substrate at least in part having a plurality of trenches lined with the sacrificial material and covering the plurality of trenches to at least in part define a plurality of closed etch channels, the device substrate further including at least one etchant path extending to the sacrificial material; and
   directing etchant through the at least one etchant path to remove at least a portion of the sacrificial material between the unreleased microstructure and the handle substrate to release the unreleased microstructure.

18. The method as defined by claim 17 wherein the device substrate comprises the unreleased microstructure and a second portion, the etchant path extending through the unreleased microstructure or through the second portion.

19. The method as defined by claim 17 further separating the unreleased apparatus to form a plurality of MEMS devices.

20. The method as defined by claim 17 wherein the plurality of etch channels are generally parallel to each other.

* * * * *